US009831026B2

(12) United States Patent
Barry et al.

(10) Patent No.: US 9,831,026 B2
(45) Date of Patent: Nov. 28, 2017

(54) HIGH EFFICIENCY ON-CHIP 3D TRANSFORMER STRUCTURE

(71) Applicant: GLOBALFOUNDRIES INC., Grand Cayman (KY)

(72) Inventors: Robert L. Barry, Essex Junction, VT (US); Venkata Nr. Vanukuru, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/950,027

(22) Filed: Jul. 24, 2013

(65) Prior Publication Data

US 2015/0028979 A1 Jan. 29, 2015

(51) Int. Cl.

*H01F 27/28* (2006.01)
*H01F 5/00* (2006.01)
*H01L 27/08* (2006.01)
*H01F 19/04* (2006.01)

(52) U.S. Cl.

CPC ......... *H01F 27/2804* (2013.01); *H01F 19/04* (2013.01); *H01F 2027/2819* (2013.01)

(58) Field of Classification Search

CPC ......... H01F 2027/2861; H01F 27/2804; H01F 17/0006; H01F 41/041; H01F 2027/2809; H01F 41/0625

USPC ............... 336/170, 182, 183, 199, 200, 208; 257/531

See application file for complete search history.

(56) References Cited

U.S. PATENT DOCUMENTS 4,613,843 A * 9/1986 Esper et al. .................. 336/232
5,852,860 A * 12/1998 Lorraine ............... B06B 1/0622 29/25.35
5,852,866 A 12/1998 Kuettner et al.
6,054,914 A * 4/2000 Abel ........................ H01F 1/344 336/200
6,198,374 B1 * 3/2001 Abel ................... H01F 17/0013 336/200

(Continued)

FOREIGN PATENT DOCUMENTS

CN 202373582 8/2012
EP 0725407 8/1996

OTHER PUBLICATIONS

Chiou, H., et al. "Broadband and Low-Loss 1:9 Transmission-Line Transformer in 0.18-UM CMOS Process" IEEE Electron Device Letters, vol. 31, Issue. 9. Sep. 2010. pp. 921-923.

Fong, N., et al. "High-Performance and Area-Efficient Stacked Transformers for RF CMOS Integrated Circuits" 2003 IEEE MTT-S International Microwave Symposium Digest, vol. 2. Jun. 2003. pp. 967-970.

(Continued)

*Primary Examiner* — Alexander Talpalatski
*Assistant Examiner* — Joselito Baisa
(74) *Attorney, Agent, or Firm* — Hoffman Warnick LLC

(57) ABSTRACT

A transformer structure includes at least three sections, each corresponding to metal layers of an integrated circuit. A first section of the at least three sections is electrically coupled to a third section with a second section disposed between the first and third sections. The at least three sections includes inductor coils, all of which are wound in a same direction and voltage phase starting at an outer terminal and continuing to an inner terminal of each inductor coil. At least one radial wiring channel passes through a portion of a coil in one of the three sections to provide an external connection to an internal terminal of the coil in at least one of the three sections.

16 Claims, 9 Drawing Sheets

(56) References Cited

U.S. PATENT DOCUMENTS

| | | | | |
|---|---|---|---|---|
| 6,429,763 | B1 * | 8/2002 | Patel | H01F 27/2804 336/192 |
| 6,707,367 | B2 | 3/2004 | Castaneda et al. | |
| 6,714,112 | B2 | 3/2004 | Beng et al. | |
| 6,717,502 | B2 * | 4/2004 | Yue | H03F 3/45183 29/602.1 |
| 6,737,948 | B2 * | 5/2004 | Aoki | H03F 1/223 336/200 |
| 6,841,847 | B2 * | 1/2005 | Sia | H01L 27/08 257/277 |
| 6,879,234 | B2 | 4/2005 | Furumiya et al. | |
| 6,940,386 | B2 * | 9/2005 | Mukherjee | H01F 17/0013 29/602.1 |
| 6,959,482 | B2 | 11/2005 | Liang et al. | |
| 7,071,806 | B2 * | 7/2006 | Masu | H01F 17/0006 29/602.1 |
| 7,283,029 | B2 | 10/2007 | Weon et al. | |
| 7,370,403 | B1 | 5/2008 | Hsu et al. | |
| 7,372,336 | B2 * | 5/2008 | Lee | H03F 1/02 330/276 |
| 7,405,642 | B1 | 7/2008 | Hsu et al. | |
| 7,439,841 | B2 * | 10/2008 | Kim | H01F 17/0006 257/E27.046 |
| 7,570,144 | B2 | 8/2009 | Lim et al. | |
| 7,671,714 | B2 | 3/2010 | Tiemeijer | |
| 7,675,397 | B2 * | 3/2010 | Kim | H01F 19/04 336/192 |
| 7,705,704 | B2 | 4/2010 | Lee et al. | |
| 7,755,292 | B1 | 7/2010 | Tuma et al. | |
| 7,782,165 | B2 * | 8/2010 | Kim | H03F 3/604 336/200 |
| 7,808,356 | B2 | 10/2010 | Papananos | |
| 7,952,458 | B2 | 5/2011 | Ezzendine | |
| 7,978,041 | B2 * | 7/2011 | Bertilsson | H01F 27/2804 336/200 |
| 8,068,003 | B2 | 11/2011 | Chen et al. | |
| 8,081,056 | B2 | 12/2011 | Lee et al. | |
| 8,334,747 | B2 * | 12/2012 | Matsumoto | 336/200 |
| 8,536,948 | B2 * | 9/2013 | Kawai | H01P 5/10 330/124 R |
| 8,692,641 | B2 * | 4/2014 | Singh | A61N 1/0553 336/200 |
| 8,786,393 | B1 * | 7/2014 | Chen | 336/173 |
| 2004/0021227 | A1 | 2/2004 | Wantanabe | |
| 2006/0087384 | A1 | 4/2006 | Ezzendine | |
| 2007/0296519 | A1 | 12/2007 | Ezzeddine et al. | |
| 2008/0218300 | A1 | 9/2008 | Loef et al. | |
| 2008/0272875 | A1 | 11/2008 | Huang et al. | |
| 2009/0146770 | A1 * | 6/2009 | Lee et al. | 336/200 |
| 2009/0153260 | A1 | 6/2009 | Rofougaran | |
| 2009/0284339 | A1 | 11/2009 | Choi et al. | |
| 2010/0225400 | A1 | 9/2010 | Rofougaran et al. | |
| 2011/0032065 | A1 | 2/2011 | Raczkowski | |
| 2011/0316657 | A1 | 12/2011 | Park et al. | |
| 2012/0056297 | A1 | 3/2012 | Akhtar et al. | |
| 2012/0056680 | A1 | 3/2012 | Kim et al. | |
| 2012/0248978 | A1 * | 10/2012 | Howald | H01J 37/321 315/34 |
| 2015/0028987 | A1 | 1/2015 | Barry et al. | |

OTHER PUBLICATIONS

Hsu, F., et al. "Design of On-Chip Transformer With Various Coil Widths to Achieve Minimal Metal Resistance" IEEE Electron Device Letters, vol. 28, No. 11. Nov. 2007. pp. 1029-1032.

Hsu, F., et al. "Layout Design of On-Chip Transformer With Uniform Variation of Coil Widths" European Microwave Conference. EuMC 2009. Sep. 2009. pp. 1199-1202.

Ito, T., et al. "Characterization of On-Chip Multiport Inductors for Small-Area RF Circuits" IEEE Transactions on Circuits and Systems—I: Regular Papers, vol. 56, No. 8. Aug. 2009. pp. 1590-1597.

Leite, B., et al. "Design and Characterization of CMOS Millimeter-Wave Transformers" 2009 SBMO/IEEE MTT-S International Wave and Optoelectronics Conference (IMOC). Nov. 2009. pp. 402-406.

Lim, C., et al. "An Area Efficient High Turn Ratio Monolithic Transformer for Silicon RFIC" 2008 IEEE radio Frequency Integrated Circuits Symposium. Apr. 2008. pp. 167-170.

Lim, S., et al. "Extremely High-Q Stacked Transformer-Type Inductors for RF Applications" 2003 International Symposium on VLSI Technology, Systems, and Applications. Oct. 2003. pp. 147-150.

Lopez-Villegas, J., et al. "Improvement of the Quality Factor of RF Integrated Inductors by Layout Optimization" IEEE Transactions on Microwave Theory and Techniques, vol. 48, No. 1. Jan. 2000. pp. 76-83.

Weon, D. "High-Q Three-Dimensional Inductors and Transformers for High Frequency Applications" Dissertation No. AAI3287260 for Purdue University. 2007. (136 Pages).

Wu, C., et al. "Analysis and Application of Miniature 3D Inductor" ISCAS 2002. IEEE International Symposium on Circuits and Systems, vol. 2. May 2002. pp. 811-814.

Yousef, K., et al. "Design of 3D Integrated Inductors for RFICS" 2012 Japan-Egypt Conference on Electronics, Communications and Computers (JEC-ECC). Mar. 2012. pp. 22-25.

Zolfaghari, A., et al. "Stacked Inductors and Transformers in CMOS Technology" IEEE Journal of Solid-State Circuits, vol. 36, No. 4. Apr. 2001. pp. 620-628.

Barry, R., et al. "Folder Conical Inductor" U.S. Appl. No. 13/654,529, filed Oct. 18, 2012. (86 Pages).

Non-Final Office Action issued in U.S. Appl. No. 13/950,947 dated Jan. 12, 2015. (9 Pages).

Office Action for U.S. Appl. No. 13/950,557 dated on Feb. 18, 2015.

Kim, J., et al. "High-Performance Three-Dimensional On-Chip Inductors in SOI CMOS Technology for Monolithic RF Circuit Applications" 2003 IEEE Radio Frequency Integrated Circuits Symposium. Jun. 2003. pp. 591-594.

Park, J., et al. "Monolithically Integrated 3-D Micro-Inductors and Micro-Transformers for RF Applications" 8th International Symposium on Advanced Packaging Materials. Mar. 2002. pp. 362-363.

Young, D., et al. "Monolithic High-Performance Three-Dimensional Coil Inductors for Wireless Communication Applications" International Electron Devices Meeting (IEDM '97)—Technical Digest. Dec. 1997. pp. 67-70.

Office Action dated Apr. 8, 2015 for U.S. App. No. 13/950,008.

Notice of Allowance dated Jul. 30, 2012 for U.S. Appl. No. 13/950,947.

Office Action dated Aug. 6, 2015 for U.S. Appl. No. 13/950,557.

* cited by examiner

HIGH EFFICIENCY ON-CHIP 3D TRANSFORMER STRUCTURE

RELATED APPLICATION DATA

This application is related to commonly assigned application Ser. No. 13/950,008 filed concurrently herewith and incorporated herein by reference.

BACKGROUND

Technical Field

The present invention relates to integrated circuits, and more particularly to three-dimensional integrated circuit transformer structures configured for high turns ratios for use with high frequency applications.

Description of the Related Art

With an increased demand for personal mobile communications, integrated semiconductor devices such as complementary metal oxide semiconductor (CMOS) devices may, for example, include voltage controlled oscillators (VCO), low noise amplifiers (LNA), tuned radio receiver circuits, or power amplifiers (PA). Each of these tuned radio receiver circuits, VCO, LNA, and PA circuits may, however, require on-chip inductor components in their circuit designs.

Several design considerations associated with forming on-chip inductor components may, for example, include quality factor (i.e., Q-factor), self-resonance frequency ($f_{SR}$), and cost considerations impacted by the area occupied by the formed on-chip inductor. Accordingly, for example, a CMOS radio frequency (RF) circuit design may benefit from, among other things, one or more on-chip inductors having a high Q-factor, a small occupied chip area, and a high $f_{SR}$ value. The self-resonance frequency ($f_{SR}$) of an inductor may be given by the following equation:

$$f_{SR} = \frac{1}{2\pi\sqrt{LC}},$$

where L is the inductance value of the inductor and C may be the capacitance value associated with the inductor coil's inter-winding capacitance, the inductor coil's interlayer capacitance, and the inductor coil's ground plane (i.e., chip substrate) to coil capacitance. From the above relationship, a reduction in capacitance C may desirably increase the self-resonance frequency ($f_{SR}$) of an inductor. One method of reducing the coil's ground plane to coil capacitance (i.e., metal to substrate capacitance) and, therefore, C value, is by using a high-resistivity semiconductor substrate such as a silicon-on-insulator (SOI) substrate. By having a high resistivity substrate (e.g., >50 Ω-cm), the effect of the coil's metal (i.e., coil tracks) to substrate capacitance is diminished, which in turn may increase the self-resonance frequency ($f_{SR}$) of the inductor.

The Q-factor of an inductor may be given by the equation:

$$Q = \frac{\omega L}{R},$$

where ω is the angular frequency, L is the inductance value of the inductor, and R is the resistance of the coil. As deduced from the above relationship, a reduction in coil resistance may lead to a desirable increase in the inductor's Q-factor. For example, in an on-chip inductor, by increasing the turn-width (i.e., coil track width) of the coil, R may be reduced in favor of increasing the inductors Q-factor to a desired value. In radio communication applications, the Q-factor value is set to the operating frequency of the communication circuit. For example, if a radio receiver is required to operate at 2 GHz, the performance of the receiver circuit may be optimized by designing the inductor to have a peak Q frequency value of about 2 GHz. The self-resonance frequency ($f_{SR}$) and Q-factor of an inductor are directly related in the sense that by increasing $f_{SR}$, peak Q is also increased.

On-chip transformers are formed from inductor-like structures. On-chip transformers are needed in radiofrequency (RF) circuits for a number of functions including impedance transformation, differential to single conversion and vice versa (balun), DC isolation and bandwidth enhancement to name a few. Some performance metrics of on-chip transformers may include a coefficient of coupling (K), occupied area, impedance transformation factor (turns ratio), power gain, insertion loss, efficiency and power handling capability.

SUMMARY

A transformer structure includes at least three sections, each corresponding to metal layers of an integrated circuit. A first section of the at least three sections is electrically coupled to a third section with a second section disposed between the first and third sections. The at least three sections includes inductor coils, all of which are wound in a same direction and voltage phase starting at an outer terminal and continuing to an inner terminal of each inductor coil. At least one radial wiring channel passes through a portion of a coil in one of the three sections to provide an external connection to an internal terminal of the coil in at least one of the three sections.

An in-phase transformer structure includes a primary coil including one or more spiral coils disposed in one or more metal layers of an integrated circuit. A first portion of a secondary coil is disposed on a first side of the primary coil and includes one or more spiral coils disposed in one or more metal layers of the integrated circuit. A second portion of the secondary coil is disposed on a second side of the primary coil opposite the first side and including two or more spiral coils disposed in two or more metal layers of the integrated circuit, the first and second portions of the secondary coil being electrically connected. A via pattern connects at least two of the spiral coils of the second portion of the secondary coil disposed in one or more metal layers of the integrated circuit.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
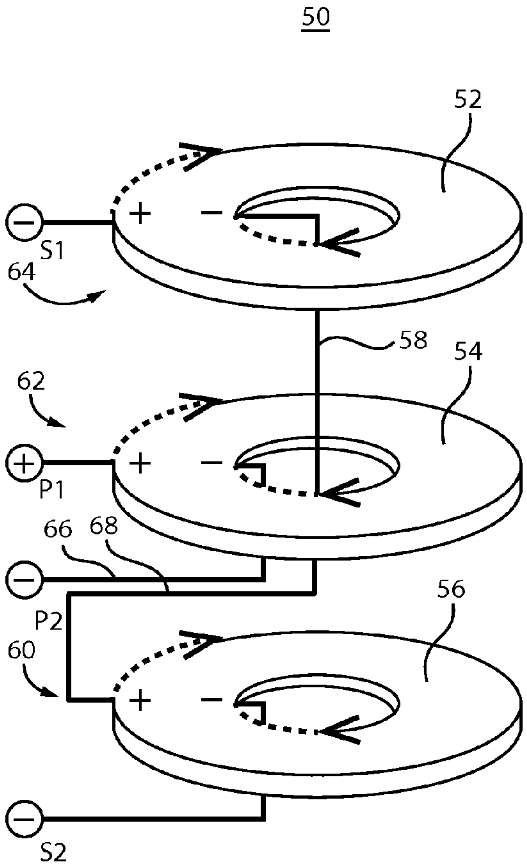
FIG. 1 is a three-dimensional schematic diagram showing an in-phase transformer structure in accordance with one embodiment.

In accordance with the present principles, transformer structures are described that provide reduced occupied area, provide a high turns ratio and provide a higher efficiency. The transformer structures are integrated into metal layers of an integrated circuit device. A transformer in accordance with one embodiment includes a primary coil whose width and spacing varies from outer turns to inner turns optimizing ohmic and eddy current losses. A secondary coil has series parallel interconnections of a top metal portion (above the primary) and a bottom metal section (below the primary) resulting in higher impedance transformation ratio. Note the primary and secondary nomenclature can be reversed as the primary may be split into two sections above and below the secondary coil. Minimized loss in the both the primary and secondary results in higher power gain when compared to existing conventional solutions.

The present embodiments find utility in any device that includes or needs a transformer and, in particularly useful embodiments, the present principles provide transformers for high frequency applications such as communications applications, e.g., in GSM and CDMA frequency bands, amplifiers, power transfer devices, etc.

It is to be understood that the present invention will be described in terms of a given illustrative architecture formed on a wafer and integrated into a solid state device or chip; however, other architectures, structures, materials and process features and steps may be varied within the scope of the present invention. The terms coils, inductors and windings may be employed interchangeably throughout the disclosure. It should also be understood that these structures may take on any useful shape including rectangular, circular, oval, square, polygonal, etc.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a three dimensional wiring diagram shows an in-phase transformer 50 in accordance with one illustrative embodiment. The transformer 50 includes a primary coil 54 disposed between portions of a secondary coil. The secondary coil includes a first secondary coil 52 and a second secondary coil 56. The secondary coils 52 and 56 sandwich the primary coil 54. It should be noted that the number of coils (primary and/or secondary) can be changed as needed. Transformer 50 includes a multilayer structure, which may be disposed on vertically stacked metal layers. For example, a first metal layer 60 may include M1 or M2, a second metal layer 62 may include M3, a third metal layer 64 may include M4, and so on. The metal layers may correspond to the back end of the line (BEOL) region of a semiconductor device.

Being disposed on different layers, connections between the coils and other components, e.g., power sources, etc. is made to the coils 52, 54 and 56 with connections S1 and S2 and P1 and P2. In addition, the secondary coils 52 and 56 are connected through an interlevel connection 58 (e.g., vias between metal layers). Since the winding direction in maintained in a same direction for all of the coils 52, 54 and 56, wiring channels are needed in layer 62 for lines 66 and 68. Voltage polarities are illustratively shown as +'s and −'s, but may be reversed as needed.

Figure 2:
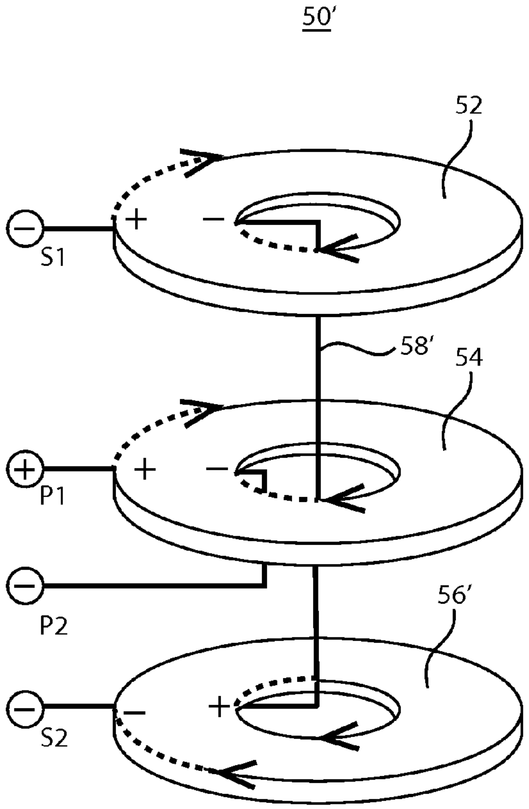
FIG. 2 is a three-dimensional schematic diagram showing an out-of-phase transformer structure in accordance with another embodiment.

The three layer transformer structure 50 includes all windings in the same direction and phase, in combination with the primary coil 54 being centrally located between two halves of the secondary coil 52 and 56, which may be connected together in series or in parallel. This structure results in a high coupling coefficient, which increases efficiency and bandwidth. It should be noted that while FIG. 1 and FIG. 2 represent the coils as disks, the coils may take on any number of useful structures. For example, a folded conical structure (or folded/multi-layered solenoidal spiral) may be employed for one or both portions of the secondary coil 52, 56 to increase the turns ratio while retaining the performance. In addition, variable wire width and wire spacings may be employed on each layer and can also increase efficiency and bandwidth. In another embodiment, parallel spiral layers are preferred to be employed to increase efficiency. The primary coil 54 may also include multiple adjacent layers of inductor coils connected in parallel.

Each layer (e.g., 60, 62, 64) includes a number of turns in a paralleled spiral configuration. While the number of turns on each layer (60, 62, 64) is independent, the best coupling can be achieved when the primary and both secondary sections have the same number of turns and the same width, space and other dimensions. For a folded conical or folded solenoid structure improved bandwidth may be achieved by skipping one or more metal layers. It should be understood that the primary and secondary coils may be interchanged.

The portion 56 of the secondary coil may include a plurality of metal layers. The lower metal layers are sometimes very thin, so by connecting a number of metal layers in parallel using vias or a via pattern, a parallel stacked spiral having two or more metal layers may be achieved.

The inductor coils of the primary coil 54 may be reduced in number and made wider than the adjacent inductor coils in the secondary coil portion 52 and 56 to increase turns ratio, reduce series losses and increase current handling. The inductor coils of the section 52 may be decreased in width and increased in spacing, as compared to the inductor coils of the primary coil 56, from an outermost turn to an innermost turn to reduce series losses. The inductor coils of the portion 56 may include a finer spacing than coils in the other sections 52, 54 to increase the turns ratio. The inductor coils of the portion 56 may include a wider track width than the inductor coils in the portion 52 to reduce series losses and increase current handling. The inductor coils of the portion 56 may be offset from the inductor coils of the primary coil 54 to increase performance.

Referring to FIG. 2, a three dimensional wiring diagram shows an out-of-phase transformer 50' in accordance with another illustrative embodiment. The transformer 50' includes a primary coil 54 disposed between portions of a secondary coil. The secondary coil includes a first secondary coil 52 and a second secondary coil 56'. The secondary coils 52 and 56' sandwich the primary coil 54. It should be noted that the number of coils (primary and/or secondary can be changed as needed). Transformer 50' includes a multilayer structure, which may be disposed on vertically stacked metal layers.

The secondary coils 52 and 56' are connected through an interlevel connection 58' which is connected in a radial direction opposite that depicted in FIG. 1. The connection 58' is made to the inside of the coil 56' and the polarity of the voltage is switched to change the winding direction. By reversing the winding in the lower portion of the secondary coil 56', high frequency performance in increased. Also, the two radial wiring channels (66, 68) needed in FIG. 1 (in-phase) are not needed in FIG. 2 (out-of-phase).

The transformer structures 50 and 50' (sometimes called and used as a balun) on an integrated circuit or other layered or three dimensional wiring constructs may include spiral windings having a circular, a square, an octagonal or other polygonal shape. The windings are preferably stacked one above the other and all with a common axis. Top and bottom sets of windings or coils 52, 56 (or 56') are combined as the secondary (or alternately as the primary winding) and are connected together in series with a winding direction so as to create a positive mutual inductance between the top and bottom portions (52, 56 (or 56').

To generalize the structures 50, 50', a top section includes X number of conducting layers and a bottom section includes Z number of conducting layers. A middle layer of the structure 50, 50' forms the primary (or alternately the secondary) winding and is wound in the same direction as the top portion of the secondary winding or coil 52 and is comprised of Y number of conducting layers connected together in parallel.

In one embodiment, a high performance transformer includes the primary coil 54 and secondary coils 52, 56 (or 56') where the secondary coil of the transformer comprises of two sections of spiral, with a top section being, e.g., a folded solenoidal spiral of the top X metals and the bottom section being, e.g., a parallel stacked spiral of the bottom Z metals. X, Y and Z represent an arbitrary number of vertically adjacent metal layers, with the specific number chosen to optimize performance. The primary coil 54 of the transformer 50, 50' comprises one or more parallel spirals of Y metals with at least one gradually decreasing width and increasing spacing from outermost turn to the innermost. The sum X+Y+Z represents the total number of vertically adjacent metal layers chosen to comprise the transformer structure 50, 50'. This sum can be equal to the total number of metal layers present, or may be a smaller number chosen to optimize performance.

Different configurations or shapes may be employed for the coils. The coils may include a solenoid configuration, which includes a cork screw-like three-dimensional configuration. The coils may include a spiral configuration, which includes an in-plane spiral that winds from outside to inside in a spiral. The coils may include a conical configuration, which includes a cork screw-like three-dimensional configuration that spirals along an axis of the cone. Folded configurations include a reversal of direction of a shape and the coil follows the shape. For example, a folded conical includes a cone that has its apex reversed and the coils first follows the cone and then the reversed apex.

Figure 3:
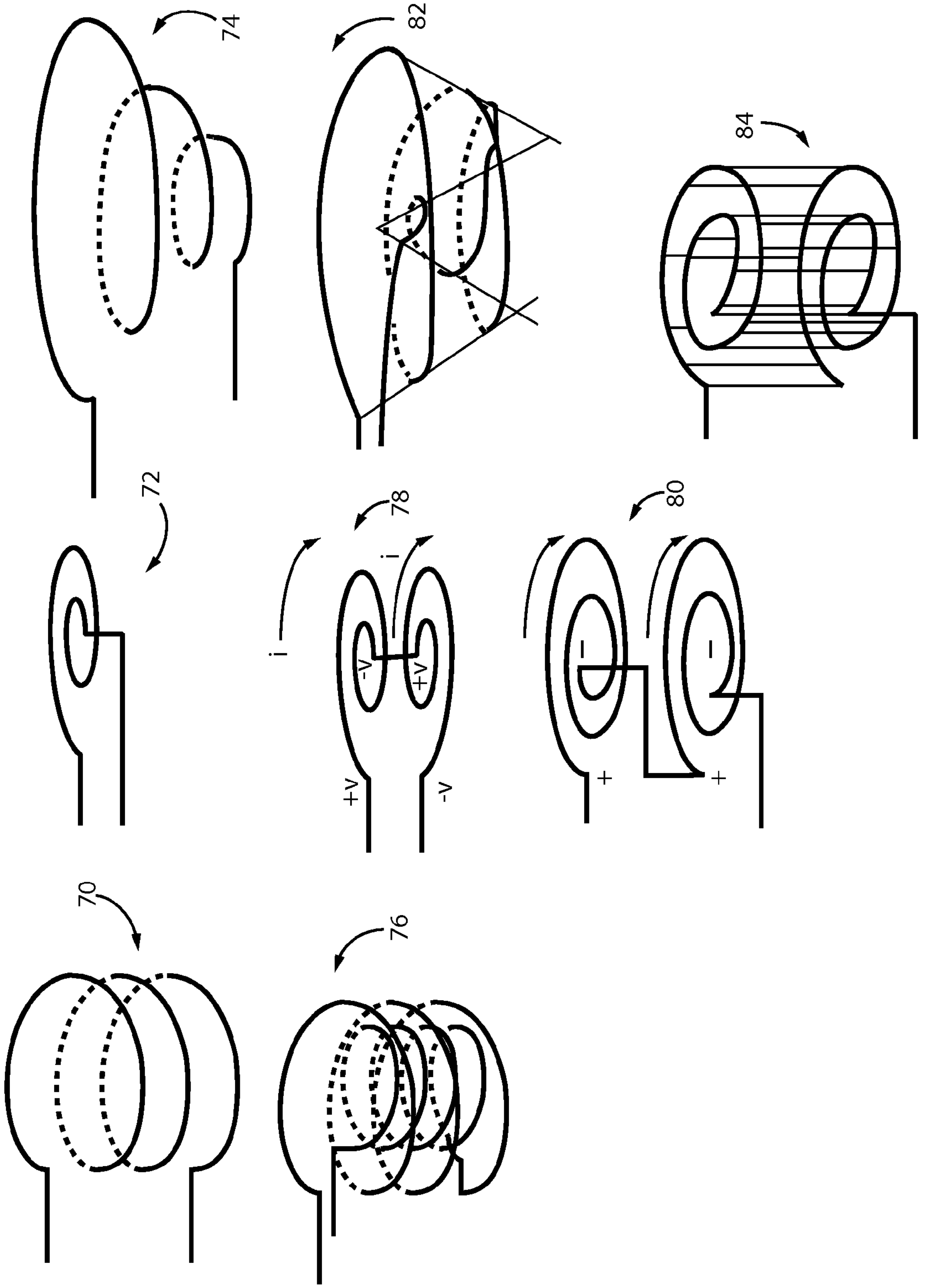
FIG. 3 is a diagram showing inductor/coil configurations for use in accordance with the present principles.

Referring to FIG. 3, a plurality of configurations is illustratively depicted and includes the following. A solenoid shape 70, a spiral shape 72, a conical shape 74, a multi-layered (two) spiraled solenoid shape 76, a stacked spiral (out-of-phase voltage) 78, a stacked spiral (in-phase voltage) 80, a folded conical 82 (can be folded more than once), a parallel stacked spiral (adjacent spiral are connected by vias along the spirals) 84, etc.

Figure 4:
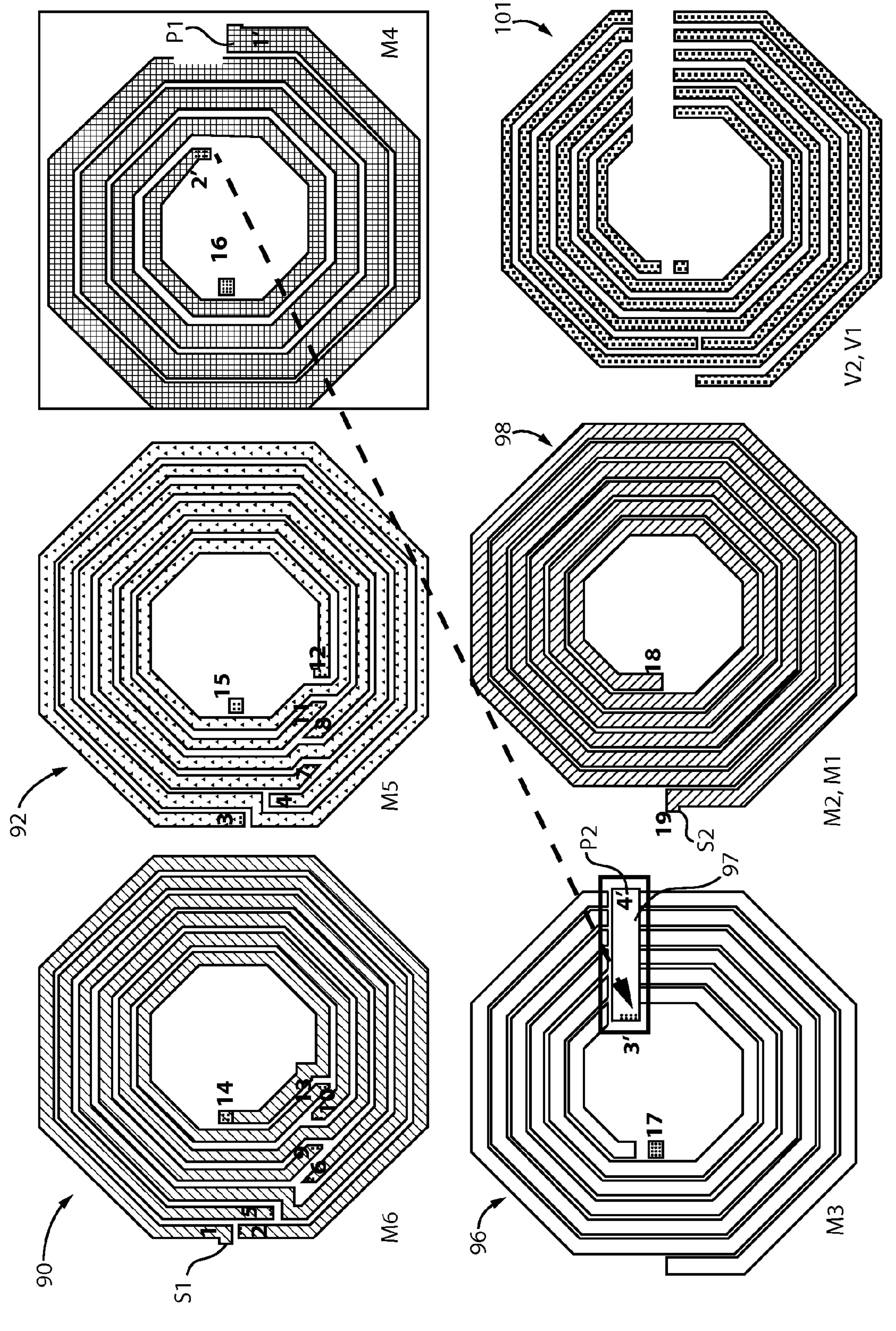
FIG. 4 is a layout view showing layers of spirals for a transformer structure in accordance with one illustrative embodiment.

Referring to FIG. 4, levels of a transformer structure 100 are shown in accordance with one embodiment. In this embodiment, a secondary coil includes a first (top) portion 90, 92 that includes two metal layers (e.g., M6 and M5). The secondary coil may include a solenoid shape, a folded solenoid shape or a folded conical shape. A folded solenoid shape includes winding up or down between levels in a solenoid shape. This is similar to a folded conical shape except each adjacent rotation alternates to drop down or wind up between the metal levels.

In the present embodiment, a folded conical or solenoidal shape is provided, which will be described using the numbers 1-19 in FIG. 4. The structure includes the secondary coil having a spiral stack of vertically folded solenoids or vertically folded conical spirals. The connections to the secondary coil are indicated by S1 and S2, and the connections to the primary coil are indicated by P1 and P2.

The top portion 90 on layer M6 begins a point 1 and wraps around to point 2 then connects by a via to point 3 in layer M5. The coil wraps around to point 4 in layer M5 and then returns back up to layer M6 at point 5. The coil wraps around to point 6 and then drops down again to layer M5 at point 7. The coil wraps around again to point 8 in the M5 layer. Then, back up to the M6 layer at point 9. The coil wraps around to point 10 and then back down to the M5 layer at point 11. The coil wraps around again to point 12 in the M5 layer, and then back up to point 13 in the M6 layer. The coil wraps around again to point 14 in the M5 layer. From point 14, a via connects through layer M5 in the second coil 92 of the secondary coil and continues through to point 16 in a first layer or coil 94 of a primary coil in metal layer M4. From point 16, a via connects through metal layer M3 to which provides a second layer or coil 96 of the primary coil to point 17. Point 17 connects to point 18 in metal layer M2 and/or M1 to connect to point 19, which includes an end of another coil 98 for the secondary coil.

The coils 90 and 92 of this embodiment include a similar spacing between lines and line width. The coil 94, which is a primary coil, includes a variable width and spacing to reduce losses and increase electric isolation between the primary coil and the secondary coil. The coil 94 begins at point 1' and warps around to point 2' (a spiral) in metal layer M4. As the coil 94 wraps between point 1' and point 2', the lines width increases and the spacing between adjacent portions decreases. A via connects point 2' to point 3' in metal layer M3. Point 3' is a first end of a wire channel 97, which extends to point 4' or P2. Providing the wire channel 97 and P2 in the M3 layer along with an entire coil 96 for the secondary coil substantially improves the performance of the transformer.

The coil 96 follows the coil pattern of the coil 98 below it. Coil 98 includes a spiral coil that connects with the coils 90 and 92 to form the secondary coil. The coil 96 in the M3 layer is connected to coil 98 in the M2 layer by a via pattern 101 to provide a parallel stacked spiral configuration. In addition, the coil 98 may be connected to another coil (not shown) in metal layer M1 using the same or similar via pattern 101 to provide an additional tier for the parallel stacked spiral configuration for the lower coils of the secondary coil.

Figure 5:
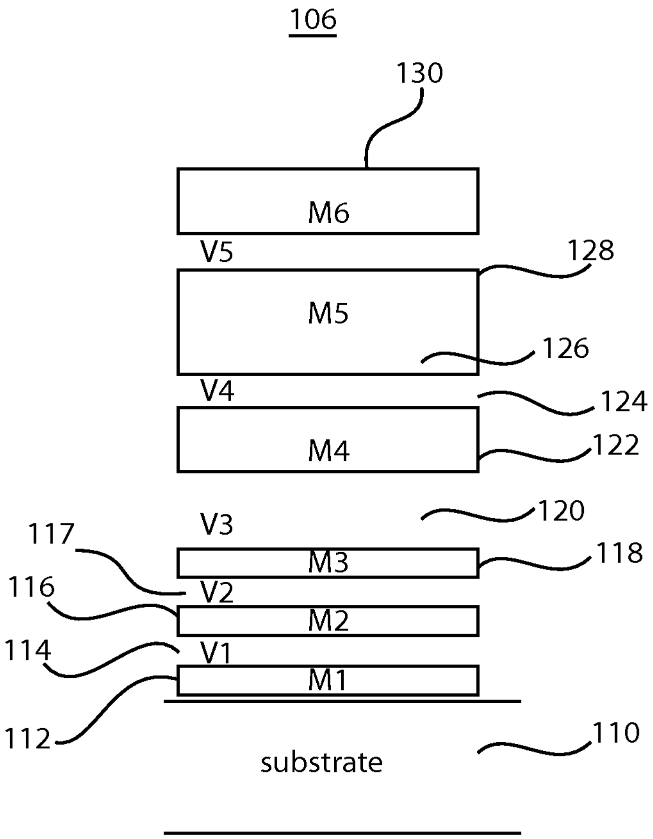
FIG. 5 is a cross-sectional view showing a metal layer stack for realizing the embodiment of FIG. 4.

Referring to FIG. 5, a cross-sectional view of a semiconductor device or integrated circuit chip 108 is shown in accordance with one illustrative embodiment. A substrate 110 may include a silicon on-insulator (SOI) substrate, although other substrates may be employed. The SOI substrate offers less capacitance to structures formed thereon than bulk substrates. In addition, the SOI substrate permits use of lower metal layers for use in inductors and transformers. FIG. 5 depicts metal layer M1 112 and metal layer M2 116 having a dielectric layer 114 therebetween. It is through this dielectric layer 114 that the via pattern (V1) 101 extends to connect the coils in the M1 layer 112 and the M2 layer 116. Likewise, metal layer M3 118 and metal layer M2 116 have a dielectric layer 120 therebetween. It is through this dielectric layer 117 that the via pattern (V2) 101 extends to connect the coils in the M3 layer 118 and the M2 layer 116. A dielectric layer 120 separates M3 metal layer 118 from M5 metal layer 122. Metal layers 122 (M4), 124 (M5) and 130 (M6) are separated by dielectric layers 124, and 126, respectively. Vias V3, V4 and V5 may be employed to make connections, if needed. Metal layers (M6 and M5) 126, 130 provide sufficient thickness to permit a solenoidal or conical (or folded solenoidal or folded conical) winding in each metal layer.

Figure 7:
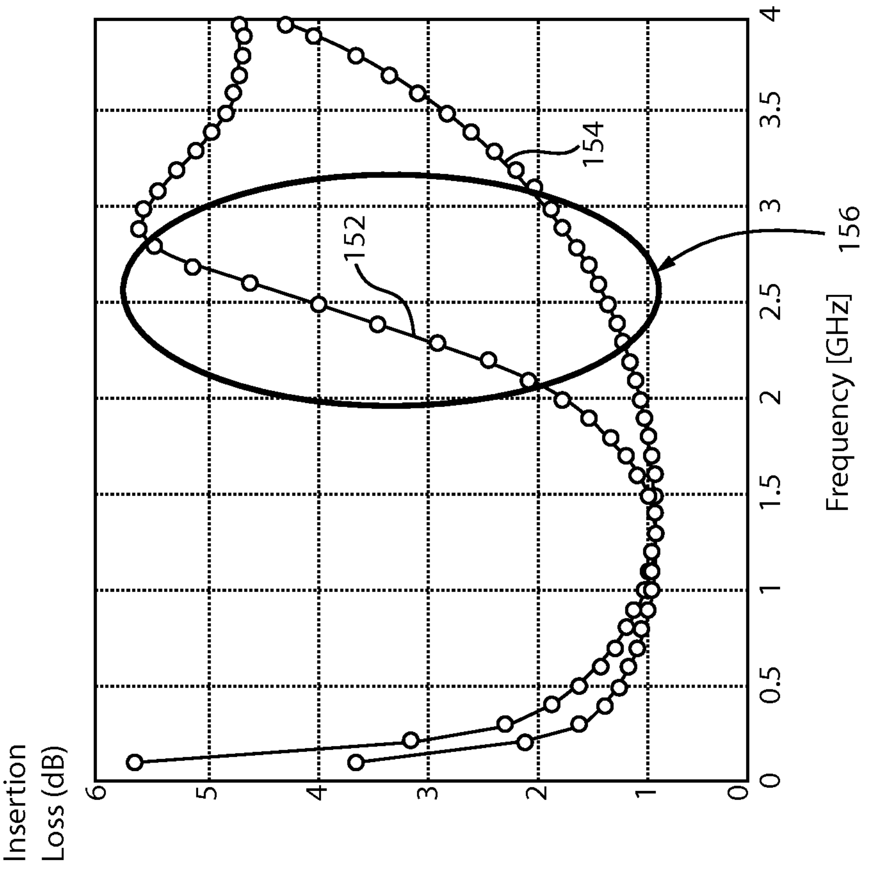
FIG. 7 is a plot of insertion loss versus frequency (GHz) for the structure of FIG. 4 and the comparison structure.
Figure 6:
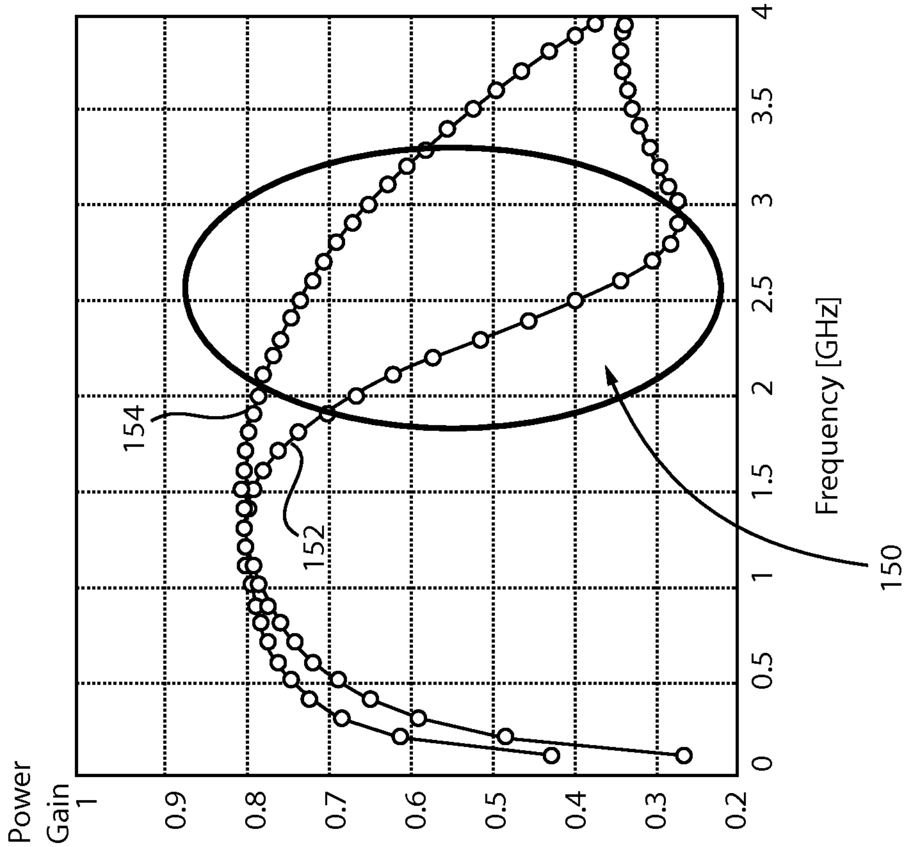
FIG. 6 is a plot of power gain versus frequency (GHz) for the structure of FIG. 4 and a comparison structure.

Referring to FIGS. 6 and 7, simulation data is shown comparing the configuration of FIG. 4 (present structure 154) with a design having spiral primary coil disposed between two spiral coils making up a secondary coil (comparison structure 152). FIG. 6 plots power gain versus frequency (GHz) for the present structure 154 and the comparison structure 152. As can be seen in region 150, a 20-30% improvement is achieved in power gain between 2 GHz and 3 GHz. The devices tested include a turns ratio of approximately 4, K>0.9 and area=300×300 sq. microns.

FIG. 7 plots insertion loss (dB) versus frequency (GHz) for the present structure 154 and the comparison structure 152. As can be seen in region 156, a 1-3 dB reduction in insertion loss is achieved between 2 GHz and 3 GHz. The devices tested include a turns ratio of approximately 4, K>0.9 and area=300×300 sq. microns.

Figure 8:
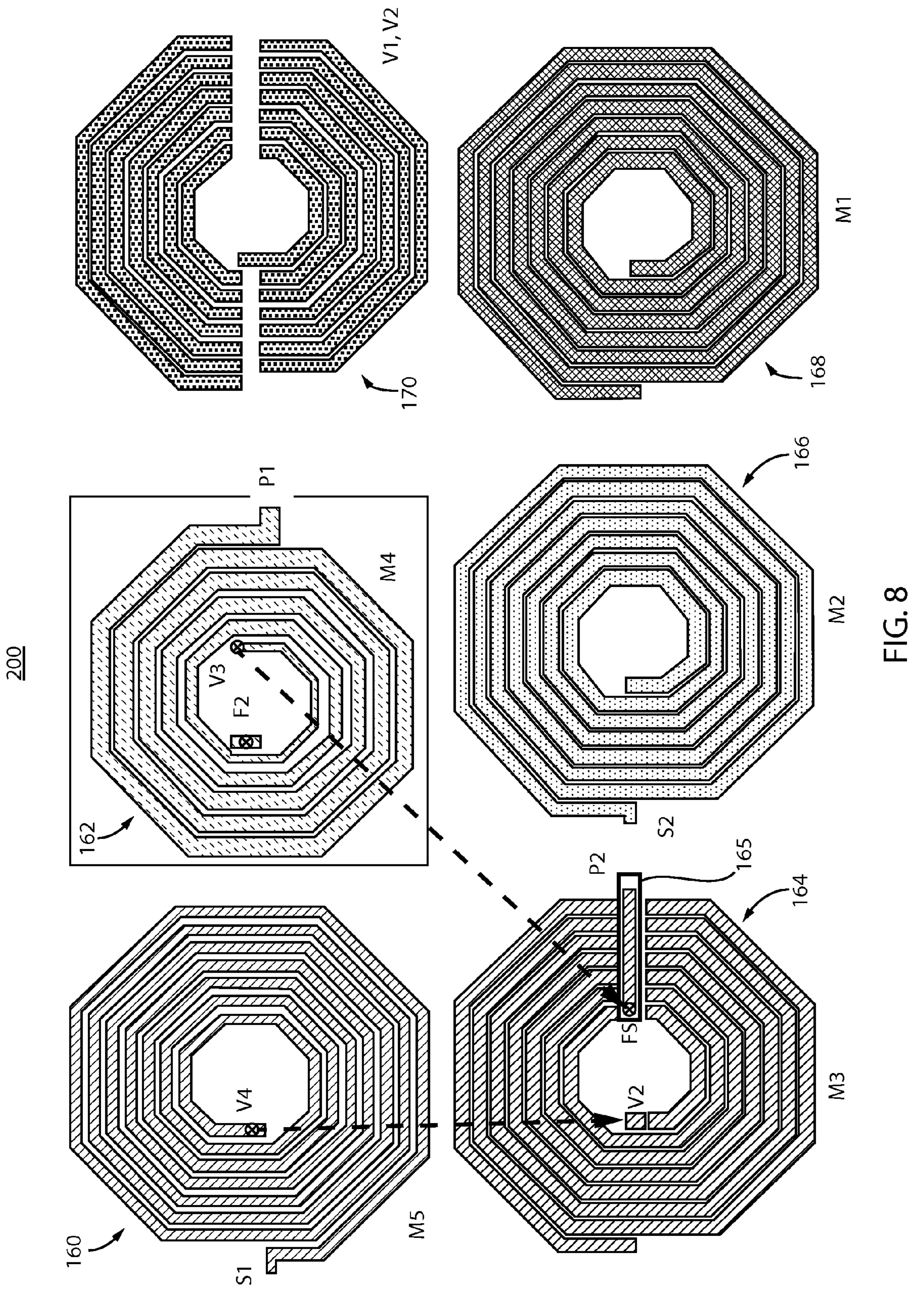
FIG. 8 is a layout view showing layers of spirals for a transformer structure in accordance with another illustrative embodiment.

Referring to FIG. 8, levels of a transformer structure 200 are shown in accordance with another embodiment. In this embodiment, a secondary coil includes a first (top) portion that includes a coil 160 in a single metal layer (e.g., M5). The secondary coil may include a solenoid shape or a spiral shape. The secondary coil also include coils 164, 166 and 168 which are disposed in other metal layers, e.g., M3, M2 and M1, respectively. The connections between the coil 160 and the coil 164 occur through a via beginning at V4, continuing at point F2, through a metal layer M4 which includes a primary coil 162 and landing on a V2 on coil 164. The secondary coil connections are indicated by S1 and S2, and the connections to the primary coil are indicated by P1 and P2.

The coil 160 has a different spacing between lines than for coils 164, 166 and 168. The coil 162, which is a primary coil in metal layer M4, includes a variable width and spacing to reduce losses and increase electric isolation between the primary coil and the secondary coil. The coil 162 begins at point V3 and wraps around to P1. As the coil 162 wraps between V3 and P1, the line width increases and the spacing between adjacent portions decreases. A via connects point V3 to point FS in metal layer M3. FS is a first end of a wire channel 165, which extends to P2. Providing the wire channel 165 and P2 in the M3 layer along with an entire coil 164 for the secondary coil substantially improves the performance of the transformer.

The coil 164 follows the coil pattern of the coil 166 below it in M2. Coil 164 includes a spiral coil that connects with the coil 160 and coils 166 and 168 to form the secondary coil. The coil 164 in the M3 layer is connected to coil 166 in the M2 layer by a via pattern 170 (V1 and V2) to provide a parallel stacked spiral configuration. In addition, the coil 166 may be connected to another coil 168 in metal layer M1 using the same or similar via pattern 170 to provide an additional tier for the parallel stacked spiral configuration for the lower coils of the secondary coil. The via pattern 170 (and/or 101) may be continuous or include a plurality of discreet via connections.

Figure 9:
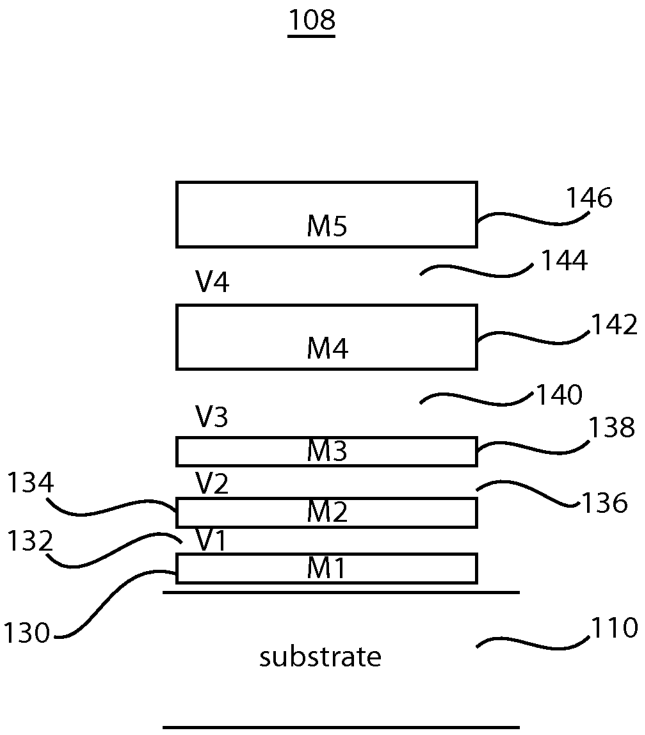
FIG. 9 is a cross-sectional view showing a metal layer stack for realizing the embodiment of FIG. 8.

Referring to FIG. 9, a cross-sectional view is of a semiconductor device or integrated circuit chip 108 is shown in accordance with another illustrative embodiment. A substrate 110 may include a silicon on-insulator (SOI) substrate, although other substrate may be employed. The SOI substrate offers less capacitance to structures formed thereon than bulk substrates. In addition, the SOI substrate permits use of lower metal layers for use in inductors and transformers. FIG. 9 depicts metal layer M1 130 and metal layer M2 134 having a dielectric layer 132 therebetween. It is through this dielectric layer 132 that the via pattern (V1) 170 extends to connect the coils in the M1 layer 130 and the M2 layer 134. Likewise, metal layer M3 138 and metal layer M2 134 have a dielectric layer 120 therebetween. It is through this dielectric layer 136 that the via pattern (V2) 170 extends to connect the coils in the M3 layer 138 and the M2 layer 116. A dielectric layer 140 separates M3 metal layer 138 from M4 metal layer 142. Metal layers 142 (M4) and 146 (M5) are separated by dielectric layer 144. Vias at V3 and V4 may also be employed.

Figure 11:
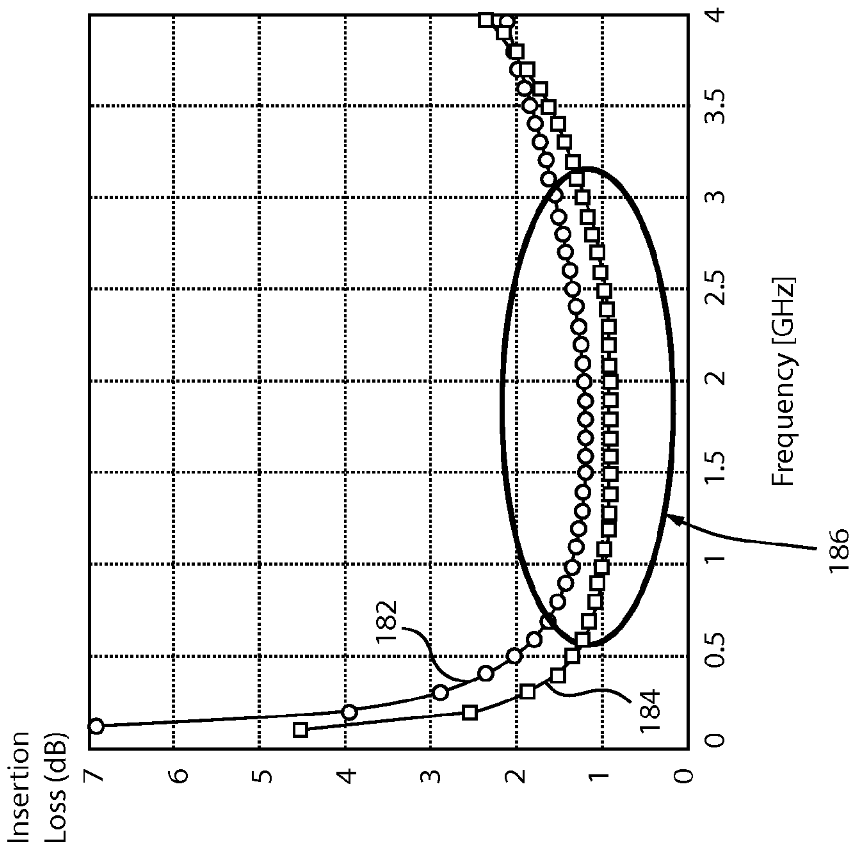
FIG. 11 is a plot of insertion loss versus frequency (GHz) for the structure of FIG. 8 and the comparison structure.
Figure 10:
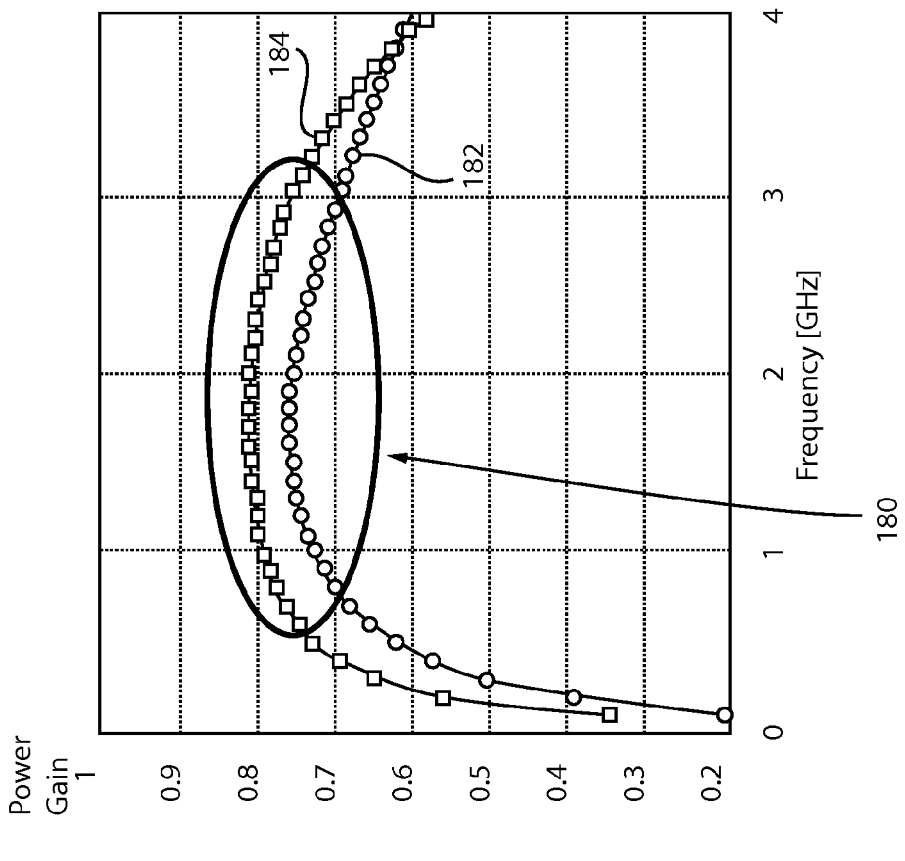
FIG. 10 is a plot of power gain versus frequency (GHz) for the structure of FIG. 8 and a comparison structure.

Referring to FIGS. 10 and 11, simulation data is shown comparing for the configuration of FIG. 8 (present structure 184) with a design having spiral primary coil disposed between two spiral coils making up a secondary coil (comparison structure 182). FIG. 10 plots power gain versus frequency (GHz) for the present structure 184 and the comparison structure 182. As can be seen in region 180, an 8-10% improvement is achieved in power gain between 800 MHz and 3 GHz. The devices simulated include a turns ratio of approximately 3, K>0.9 and area=300×300 sq. microns.

FIG. 11 plots insertion loss (dB) versus frequency (GHz) for the present structure 184 and the comparison structure 182. As can be seen in region 186, a 0.4-0.5 dB reduction in insertion loss is achieved between 800 MHz and 3 GHz. The devices simulated include a turns ratio of approximately 3, K>0.9 and area=300×300 sq. microns.

Figure 12:
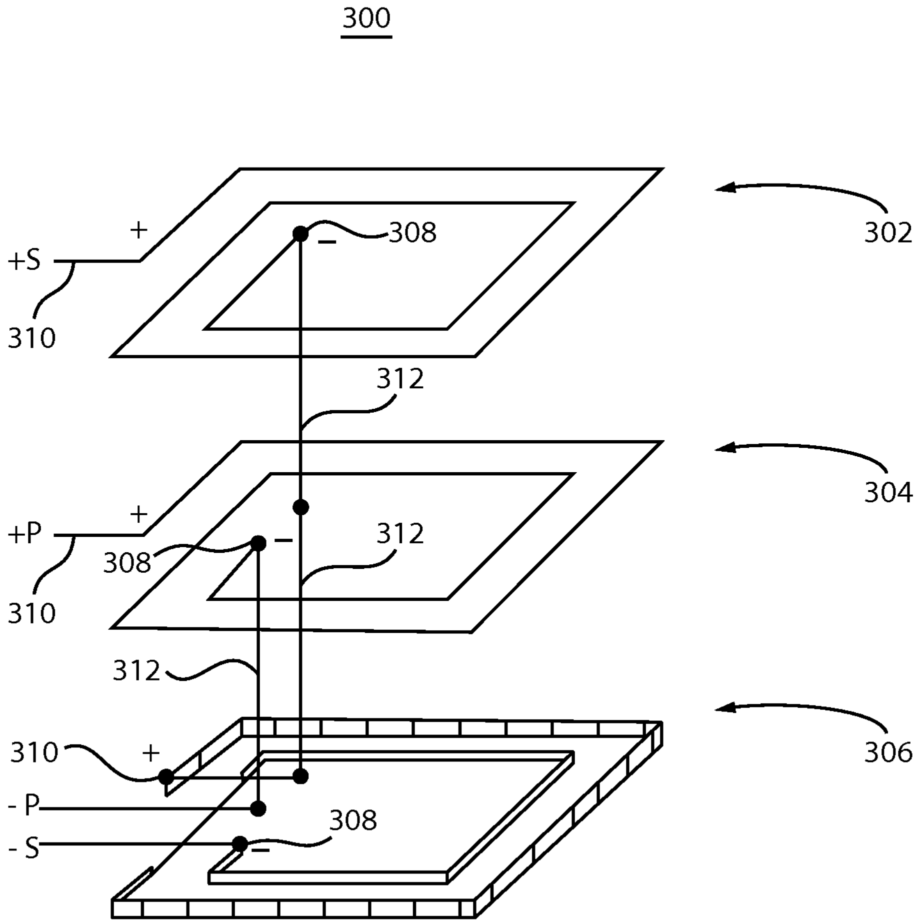
FIG. 12 is a three-dimensional schematic diagram showing another in-phase transformer structure in accordance with another embodiment.

Referring to FIG. 12, a three-dimensional schematic diagram is shown for another embodiment (similar to FIG. 8) to describe additional features in accordance with the present principles. A transformer 300 includes three planar spiral inductors 302, 304 and 306 (or modified versions thereof), each with an inner terminal 308 and outer terminal 310. The spiral inductors 302, 304 and 306 are stacked vertically adjacent to each other on parallel planes with a shared common axis and all having similar outer dimensions. Inductor 304 includes a primary, and the top and bottom inductors 302 and 306 are connected as a secondary (although functionally the primary and secondary can be interchanged). All three inductors 302, 304 and 306 are wound in a same direction (e.g., clockwise when viewed from the top) starting at the outside edge of each winding 302, 304 and 306. The inner terminals 308 of each of the three spiral inductors 302, 304 and 306 are connected by separate vias 312 vertically to one or more layers designated for radial connections (+S, +P, −S, −P) of inner spiral terminals 308 to an accessible outer edge of the structure 300. The inner terminal 308 of the primary spiral 304 and the inner terminal 308 of the top portion of the secondary 302 (as a center tap of the combined secondary structure) are connected through a break through a portion of the spiral 306 (wire channels) and thereby made available at the outer edge of the structure 300. The spiral 306 may include multiple parallel layers on different metal layers, which are connected using vias.

Connections to the inner terminals 308 of each of the three layered sections may be made with radial wiring channels on wiring layers above or below the transformer structure if available and desired, or they may be included as one or more of the layers used for any parallel wound spiral layer sections and with the use of vias and metal stacks for the needed vertical wiring 312. For the series connected secondary, three radial wiring channels may be employed, one to connect the inner terminal of the upper secondary to the outer terminal of the lower secondary and two to connect the inner terminal of the primary and the lower secondary to the exterior of the transformer structure. For the parallel connected secondary, two radial wiring channels are used to connect the inner terminal of the primary and the upper or lower secondary to the exterior of the transformer structure. For the series connected secondary with out-of-phase lower secondary, one wiring channel is used to connect the inner terminal of the primary to the exterior of the transformer structure. Wires can be of fixed width and spacing on each layer or wire widths can decrease and wire space can increase as wiring progresses from the outer terminal to the inner terminal. Other configurations are contemplated.

It should be noted that the number of coils (primary and/or secondary can be changed as needed). The transformers described herein may include multilayered structures which may be disposed on vertically stacked metal layers that correspond to the back end of the line (BEOL) region of a semiconductor device.

It should be understood that the structures described herein may be further enhance by the use of magnetic core materials. These materials may be employed for planar spirals, solenoid or conical inductors, etc. to modify the performance parameters for specific applications. A magnetic material may be introduced between sections to further increase the coupling coefficient or the coils may be formed from a high permeability magnetic material.

In some embodiments, the primary spiral (middle section) turns can be reduced in number and made wider to increase the turns ratio, reduce series losses and increase current handling. The top section of the secondary spiral turns can also have gradually decreasing width and increasing spacing from the outermost turn to innermost turn to reduce series losses. The bottom section of the secondary spiral turns can use the advantage of finer spacing to increase the turns ratio. The bottom section of the secondary spiral turns can have wider track widths than the top section to reduce series losses and increase current handling. The bottom section of the secondary spiral turns can be offset from the primary turns to increase the high frequency performance at the cost of slightly reduced turns ratio.

The 3D wiring and structures of the transformers in accordance with the present principles enhance high frequency performance with the following features: high inductance density, high Q for both primary and secondary (low insertion loss), higher turns ratio (impedance transformation ratio), suitability for high power applications, etc.

Having described preferred embodiments for high efficiency on-chip 3D transformer structures (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A transformer structure, comprising:

at least three sections, each corresponding to metal layers of an integrated circuit, the at least three sections including: a first section of the at least three sections being electrically coupled to a third section with a second section disposed between the first and third sections, wherein the at least three sections including inductor coils, all of which are wound in a same direction and voltage phase starting at an outer terminal and continuing to an inner terminal of each inductor coil;

a first wire electrically coupling an inner terminal of the inductor coil of the first section to a first intermediate terminal of the third section;

a second wire electrically coupling an inner terminal of the inductor coil of the second section to a second intermediate terminal of the third section, the second intermediate terminal of the third section distinct from the first intermediate terminal of the third section;

a break formed through a portion of the inductor coil of the third section of the at least three sections; and a plurality of radial connections positioned within the break formed through the portion of the inductor coil of the third section, the plurality of radial connections including:

a first radial connection extending between the first intermediate terminal of the third section to the outer terminal of the inductor coil of the third section, the first radial connection electrically coupling the inner terminal of the inductor coil of the first section to the outer terminal of the inductor coil of the third section; and a second radial connection extending from the second intermediate terminal of the third section to an exterior of the transformer structure, the second radial connection providing electrical accessibility to the inner terminal of the inductor coil of the second section from the exterior of the transformer structure.

2. The structure as recited in claim 1, wherein the inductor coils in the first and third sections form a primary coil and the inductor coil in the second section forms a secondary coil.

3. The structure as recited in claim 1, wherein the inductor coils in the first and third sections form a secondary coil and the inductor coil in the second section forms a primary coil.

4. The structure as recited in claim 1, wherein the first section includes a plurality of metal layers and the inductor coil in the first section includes a folded or multi-layered solenoid shape.

5. The structure as recited in claim 1, wherein the third section includes a plurality of metal layers and the inductor coil in the third section includes a parallel stacked spiral having two or more metal layers connected with a via pattern.

6. The structure as recited in claim 1, wherein the second section includes multiple adjacent layers of inductor coils connected in parallel.

7. The structure as recited in claim 1, wherein the inductor coils of the second section are reduced in number and wider than the adjacent inductor coils in the first and third sections to increase turns ratio, reduce series losses and increase current handling.

8. The structure as recited in claim 1, wherein the inductor coils of the first section are decreased in width and increased in spacing, as compared to the inductor coils of the second section, from an outermost turn to an innermost turn to reduce series losses.

9. The structure as recited in claim 1, wherein the inductor coils of the third section include a finer spacing then one or the inductor coils in the first section or the second section to increase the turns ratio.

10. The structure as recited in claim 1, wherein the inductor coils of the third section include a wider track width than the inductor coils in the first section to reduce series losses and increase current handling.

11. The structure as recited in claim 1, wherein the inductor coils of the third section are offset from the inductor coils of the second section to increase performance.

12. The structure as recited in claim 1, wherein the first section includes a plurality of metal layers, and the inductor coil in the first section includes a folded conical shape that comprises a direction reversal.

13. The structure as recited in claim 12, wherein the direction reversal is of a coil shape.

14. The structure as recited in claim 12, wherein the folded conical shape comprises a cone having a reversed apex, and the inductor coil in the first section initially follows the cone and subsequently follows the reversed apex.

15. The structure as recited in claim 1, wherein the plurality of radial connections further includes:

a third radial connection extending from the inner terminal of the inductor coil of the third section to the exterior of the transformer structure, the third radial connection providing electrical accessibility to the inner terminal of the inductor coil of the third section from the exterior of the transformer structure.

16. The structure as recited in claim 1, further comprising:

a first via formed through the at least three sections, the first via receiving the first wire electrically coupling the inner terminal of the inductor coil of the first section to the first intermediate terminal of the third section; and a second via, formed through the second section and the third section of the at least three sections, the second via receiving the second wire electrically coupling the inner terminal of the inductor coil of the second section to the second intermediate terminal of the third section.

* * * * *